(12) United States Patent
Yuan et al.

(10) Patent No.: US 10,418,578 B2
(45) Date of Patent: Sep. 17, 2019

(54) QUANTUM DOT LIGHT-EMITTING DIODE AND DISPLAY DEVICE

(71) Applicant: Shenzhen China Star Optoelectronics Semiconductor Display Technology Co., Ltd., Shenzhen (CN)

(72) Inventors: Wei Yuan, Shenzhen (CN); Shibo Jiao, Shenzhen (CN)

(73) Assignee: Shenzhen China Star Optoelectronics Semiconductor Display Technology Co., Ltd., Shenzhen (CN)

(*) Notice: Subject to any disclaimer, the term of this patent is extended or adjusted under 35 U.S.C. 154(b) by 0 days.

(21) Appl. No.: 15/576,703

(22) PCT Filed: Nov. 9, 2017

(86) PCT No.: PCT/CN2017/110203
§ 371 (c)(1),
(2) Date: Nov. 23, 2017

(87) PCT Pub. No.: WO2019/056525
PCT Pub. Date: Mar. 28, 2019

(65) Prior Publication Data
US 2019/0097150 A1 Mar. 28, 2019

(51) Int. Cl.
*H01L 31/00* (2006.01)
*H01L 51/50* (2006.01)
(Continued)

(52) U.S. Cl.
CPC .......... *H01L 51/504* (2013.01); *H01L 51/502* (2013.01); *H01L 51/5044* (2013.01);
(Continued)

(58) Field of Classification Search
CPC . H01L 51/504; H01L 51/0067; H01L 51/502; H01L 51/007; H01L 51/5221;
(Continued)

(56) References Cited

U.S. PATENT DOCUMENTS

2016/0218297 A1* 7/2016 Ito .................. H01L 51/0067
2016/0254474 A1   9/2016 Zou
(Continued)

FOREIGN PATENT DOCUMENTS

CN   104362255   2/2015
CN   105514295   4/2016
(Continued)

*Primary Examiner* — Didarul A Mazumder
*Assistant Examiner* — Wasiul Haider

(57) ABSTRACT

This disclosure provides a quantum dot light-emitting diode comprising a first electron layer, an organic light-emitting layer, a first hole layer, a second electron layer, a quantum dot light-emitting layer, and a second hole layer. The first electron layer and the first hole layer are configured to transport first electrons and first holes to the organic light-emitting layer. The organic light-emitting layer is configured to emit a first light by recombining the first electrons and the first holes. The second electron layer and the second hole layer are configured to transport second electrons and second holes to the quantum dot light-emitting layer. The quantum dot light-emitting layer is configured to emit a second light by recombining the second electrons and the second holes.

18 Claims, 4 Drawing Sheets

(51) Int. Cl.
   *H01L 51/52*    (2006.01)
   *H01L 27/32*    (2006.01)
   *H01L 51/00*    (2006.01)

(52) U.S. Cl.
   CPC .......... *H01L 27/322* (2013.01); *H01L 51/007* (2013.01); *H01L 51/0067* (2013.01); *H01L 51/5056* (2013.01); *H01L 51/5072* (2013.01); *H01L 51/5088* (2013.01); *H01L 51/5092* (2013.01); *H01L 51/524* (2013.01); *H01L 51/5221* (2013.01); *H01L 2251/558* (2013.01)

(58) Field of Classification Search
   CPC ............... H01L 51/5072; H01L 51/524; H01L 51/5088; H01L 51/5092; H01L 51/5056; H01L 2251/558; H01L 27/322
   See application file for complete search history.

(56) References Cited

U.S. PATENT DOCUMENTS

| | | | |
|---|---|---|---|
| 2016/0336525 A1* | 11/2016 | Wu | H01L 51/50 |
| 2017/0294500 A1* | 10/2017 | Song | H01L 27/3248 |
| 2018/0061911 A1* | 3/2018 | Sun | C09K 11/06 |
| 2018/0062100 A1 | 3/2018 | Xu | |
| 2018/0157356 A1* | 6/2018 | Ma | G06F 3/0412 |
| 2018/0212177 A1* | 7/2018 | Holloway | H01L 51/502 |
| 2018/0331312 A1* | 11/2018 | Pan | H01L 51/50 |

FOREIGN PATENT DOCUMENTS

| | | |
|---|---|---|
| CN | 105679955 | 6/2016 |
| CN | 105914228 | 8/2016 |
| WO | WO 2014/057971 | 4/2014 |

\* cited by examiner

QUANTUM DOT LIGHT-EMITTING DIODE AND DISPLAY DEVICE

RELATED APPLICATIONS

This application is a National Phase of PCT Patent Application No. PCT/CN2017/110203 having International filing date of Nov. 9, 2017, which claims the benefit of priority of Chinese Patent Application No. 201710864914.6 filed on Sep. 22, 2017. The contents of the above applications are all incorporated by reference as if fully set forth herein in their entirety.

FIELD AND BACKGROUND OF THE INVENTION

The present disclosure relates to the field of display technology, and more particularly to a quantum dot light-emitting diode and a display device.

Wavelength of quantum dot material, having advantages of a broad excitation spectrum, a high electron mobility, and a high light purity, may be varied with size of the quantum dot materials. Thus, the quantum dot materials are widely used in display devices.

In quantum dot liquid crystal display technology, quantum dot materials are used in backlights of liquid crystal displays. Luminescence properties of quantum dots emit a red light and a green light under a light irradiation of a blue light-emitting diode. The red light, the green light and a blue light pass through a thin film and are recombined to form a white light and make the backlight of the liquid crystal displays have a remarkable luminous effect.

Quantum dot light-emitting diode technology is a real self-luminous display technology compared to the quantum dot liquid crystal technology which only has a remarkable luminous effect. A quantum dot layer is disposed between an electron transmission layer and a hole transmission layer in the quantum dot light-emitting diode technology. Electrons and holes are transported to the quantum dot layer in response to an applied electric. Carriers are recombined to form excitons seized by the quantum dot light-emitting materials to emit a light. The quantum dot light-emitting diodes of the present disclosure can realize self-luminosity, but also the quantum dot light-emitting has a short lifespan.

SUMMARY OF THE INVENTION

The present disclosure provides a quantum dot light-emitting diode and a display device to make a longer lifespan of the quantum dot light-emitting diode.

The present disclosure provides a quantum dot light-emitting diode, comprising a first electron layer, an organic light-emitting layer, a first hole layer, a second electron layer, a quantum dot light-emitting layer, and a second hole layer that are sequentially stacked;
  wherein the first electron layer is configured to transport first electrons to the organic light-emitting layer;
  wherein the first hole layer is configured to transport first holes to the organic light-emitting layer;
  wherein the organic light-emitting layer is configured to emit a first light by recombining the first electrons and the first holes;
  wherein the second electron layer is configured to transport second electrons to the quantum dot light-emitting layer;
  wherein the second hole layer is configured to transport second holes to the quantum dot light-emitting layer;
  wherein the quantum dot light-emitting layer is configured to emit a second light by recombining the second electrons and the second holes.

According to some disclosures, doped dyes of the organic light-emitting layer comprise one or more selected from a group consisting of ASP-f, Blvd, and TPATAZ, host materials of the organic light-emitting layer comprise one or more selected from a group consisting of CBP, Taco, and TMPyPb, a thickness of the organic light-emitting layer ranges from 20 nm to 40 nm, and a wavelength of the first light emitted from the organic light-emitting layer ranges from 450 nm to 480 nm.

According to some disclosures, component materials of the quantum dot light-emitting layer comprise one or more selected from a group consisting of CdSe/ZnS, CdS/ZnS, CdSe/ZnSe, and CdS/ZnSe, a particle size of the component materials ranges from 2 nm to 5 nm, a thickness of the quantum dot light-emitting layer ranges from 20 nm to 40 nm, and a wavelength of the second light emitted from the quantum dot light-emitting layer ranges from 540 nm to 570 nm.

According to some disclosures, the first electron layer comprises a cathode, an electron injection layer and a first electron transmission layer that are sequentially stacked, and the first electron transmission layer is disposed on the organic light-emitting layer;
  wherein the cathode is configured to provide the first electrons;
  wherein the electron injection layer is configured to transport the first electrons to the first electron transmission layer;
  wherein the first electron transmission layer is configured to transport the first electrons to the organic light-emitting layer.

According to some disclosures, component materials of the cathode comprise one or more selected from a group consisting of Li, Mg, Ca, Sr, La, Ce, Eu, Yb, Al, Cs, Rb, and Ag, and a thickness of the cathode ranges from 50 nm to 200 nm;
  wherein component materials of the electron injection layer comprise one or more selected from a group consisting of LiF, NaF, and Liq, and a thickness of the electron injection layer ranges from 0.5 nm to 3 nm;
  wherein component materials of the first electron transmission layer comprise one or more selected from a group consisting of BCP, TmPyPb, Bphen, TRZ, OXD-7, TAZ, TPB1, and TPyPhB, and a thickness of the first electron transmission layer ranges from 20 nm to 60 nm.

According to some disclosures, the first hole layer comprises a first hole transmission layer and an hole generating layer disposed on the second electron layer;
  wherein the hole generating layer is configured to provide the first holes;
  wherein the first hole transmission layer is configured to transport the first holes to the organic light-emitting layer.

According to some disclosures, component materials of the first hole transmission layer comprise one or more selected from a group consisting of NPB, TDAPB, PIDATA, TDAB, BFA-1T, and TPTE, and a thickness of the first hole transmission layer ranges from 10 nm to 60 nm;
  wherein component materials of the hole generating layer comprise one or more selected from a group consisting of HATCN, CuPc, and 2-TNATA, and a thickness of the hole generating layer ranges from 5 nm to 50 nm.

According to some disclosures, the second electron layer comprises an electron generating layer and a second electron transmission layer disposed on the quantum dot light-emitting layer;
  wherein the electron generating layer is configured to provide the second electrons;
  wherein the second electron transmission layer is configured to transport the second electrons to the quantum dot light-emitting layer.

According to some disclosures, component materials of the electron generating layer comprise organic materials and metal materials, and a thickness of the electron generating layer ranges from 5 nm to 50 nm;
  wherein component materials of the second electron transmission layer comprise one or more selected from a group consisting of BCP, TmPyPb, Bphen, TRZ, OXD-7, TAZ, TPBI, and TPyPhB, and a thickness of the second electron transmission layer ranges from 20 nm to 60 nm.

According to some disclosures, the second hole layer comprises a anode, an hole injection layer and a second hole transmission layer that are sequentially stacked, and the quantum dot light-emitting layer is disposed on the second hole transmission layer;
  wherein the anode is configured to provide the second holes;
  wherein the hole injection layer is configured to transport the second holes to the second hole transmission layer;
  wherein the second hole transmission layer is configured to transport the second holes to the quantum dot light-emitting layer.

According to some disclosures, component materials of the hole injection layer comprise PEDOT:PSS, and a thickness of the hole injection ranges from 5 nm to 60 nm;
  wherein component materials of the second hole transmission layer comprise one or more selected from a group consisting of PVK, TFB, and Poly-TPD, and a thickness of the second hole transmission layer ranges from 10 nm to 60 nm.

The present disclosure provides a display device, comprising a cover plate, a quantum dot light-emitting diode, a color filter unit and a substrate that are sequentially stacked, and the quantum dot light-emitting diode comprises a first electron layer, an organic light-emitting layer, a first hole layer, a second electron layer, a quantum dot light-emitting layer, and a second hole layer that are sequentially stacked;
  wherein the first electron layer is configured to transport first electrons to the organic light-emitting layer;
  wherein the first hole layer is configured to transport first holes to the organic light-emitting layer;
  wherein the organic light-emitting layer is configured to emit a first light by recombining the first electrons and the first holes;
  wherein the second electron layer is configured to transport second electrons to the quantum dot light-emitting layer;
  wherein the second hole layer is configured to transport second holes to the quantum dot light-emitting layer;
  wherein the quantum dot light-emitting layer is configured to emit a second light by recombining the second electrons and the second holes.

According to some disclosures, doped dyes of the organic light-emitting layer comprise one or more selected from a group consisting of DSP-ph, DPVB1, and TPATAZ, host materials of the organic light-emitting layer comprise one or more selected from a group consisting of CBP, TcTa, and TMPyPb, a thickness of the organic light-emitting layer ranges from 20 nm to 40 nm, and a wavelength of the first light emitted from the organic light-emitting layer ranges from 450 nm to 480 nm.

According to some disclosures, component materials of the quantum dot light-emitting layer comprise one or more selected from a group consisting of CdSe/ZnS, CdS/ZnS, CdSe/ZnSe, and CdS/ZnSe, a particle size of the component materials ranges from 2 nm to 5 nm, a thickness of the quantum dot light-emitting layer ranges from 20 nm to 40 nm, and a wavelength of the second light emitted from the quantum dot light-emitting layer ranges from 540 nm to 570 nm.

According to some disclosures, the first electron layer comprises a cathode, an electron injection layer and a first electron transmission layer that are sequentially stacked, and the first electron transmission layer is disposed on the organic light-emitting layer;
  wherein the cathode is configured to provide the first electrons;
  wherein the electron injection layer is configured to transport the first electrons to the first electron transmission layer;
  wherein the first electron transmission layer is configured to transport the first electrons to the organic light-emitting layer.

According to some disclosures, component materials of the cathode comprise one or more selected from a group consisting of Li, Mg, Ca, Sr, La, Ce, Eu, Yb, Al, Cs, Rb, and Ag, and a thickness of the cathode ranges from 50 nm to 200 nm;
  wherein component materials of the electron injection layer comprise one or more selected from a group consisting of LiF, NaF, and Liq, and a thickness of the electron injection layer ranges from 0.5 nm to 3 nm;
  wherein component materials of the first electron transmission layer comprise one or more selected from a group consisting of BCP, TmPyPb, Bphen, TRZ, OXD-7, TAZ, TPB1, and TPyPhB, and a thickness of the first electron transmission layer ranges from 20 nm to 60 nm.

According to some disclosures, the first hole layer comprises a first hole transmission layer and an hole generating layer disposed on the second electron layer;
  wherein the hole generating layer is configured to provide the first holes;
  wherein the first hole transmission layer is configured to transport the first holes to the organic light-emitting layer.

According to some disclosures, component materials of the first hole transmission layer comprise one or more selected from a group consisting of NPB, TDAPB, PIDATA, TDAB, BFA-1T, and TPTE, and a thickness of the first hole transmission layer ranges from 10 nm to 60 nm;
  wherein component materials of the hole generating layer comprise one or more selected from a group consisting of HATCN, CuPc, and 2-TNATA, and a thickness of the hole generating layer ranges from 5 nm to 50 nm.

According to some disclosures, the second electron layer comprises an electron generating layer and a second electron transmission layer disposed on the quantum dot light-emitting layer;
  wherein the electron generating layer is configured to provide the second electrons;
  wherein the second electron transmission layer is configured to transport the second electrons to the quantum dot light-emitting layer.

According to some disclosures, component materials of the electron generating layer comprise organic materials and metal materials, and a thickness of the electron generating layer ranges from 5 nm to 50 nm;

wherein component materials of the second electron transmission layer comprise one or more selected from a group consisting of BCP, TmPyPb, Bphen, TRZ, OXD-7, TAZ, TPBI, and TPyPhB, and a thickness of the second electron transmission layer ranges from 20 nm to 60 nm.

Compared to the existing quantum dot light-emitting diode and the existing display device, the present disclosure set up the organic light-emitting layer, the quantum dot light-emitting layer, two electron layers, and two hole layers to make the quantum dot light-emitting diode a longer lifespan, wherein the two electron layers emits electrons to the organic light-emitting layer and the quantum dot light-emitting layer, respectively, and the two hole layers emits holes to the organic light-emitting layer and the quantum dot light-emitting layer, respectively.

Aforementioned contents of the present disclosure will be a better understood with reference to the following description, appended claims and accompanying figures.

DESCRIPTION OF SPECIFIC EMBODIMENTS OF THE INVENTION

The following description of every embodiment with reference to the accompanying drawings is used to exemplify a specific embodiment which may be carried out in the present disclosure. Directional terms mentioned in the present disclosure, such as "top", "bottom", "front", "back", "left", "right", "inside", "outside", "side" etc., are only used with reference to the orientation of the accompanying drawings. Therefore, the used directional terms are intended to illustrate, but not to limit, the present disclosure. In the accompanying drawings, units with similar structures are indicated by the same sign.

Reference throughout the specification to "embodiment" means that a particular feature, structure, or characteristic described in connection with the embodiment is included in at least one embodiment. Thus, appearances of the phrases "embodiment" in places throughout the specification are may be combined in any suitable manner in one or more embodiments. Thus, the particular features, structures, or characteristics illustrated or described in connection with one embodiment may be combined, in whole or in part, with the features structures, or characteristics of one or more other embodiments without limitation. Such modifications and variations are intended to be included within the scope of the present invention.

Figure 1:
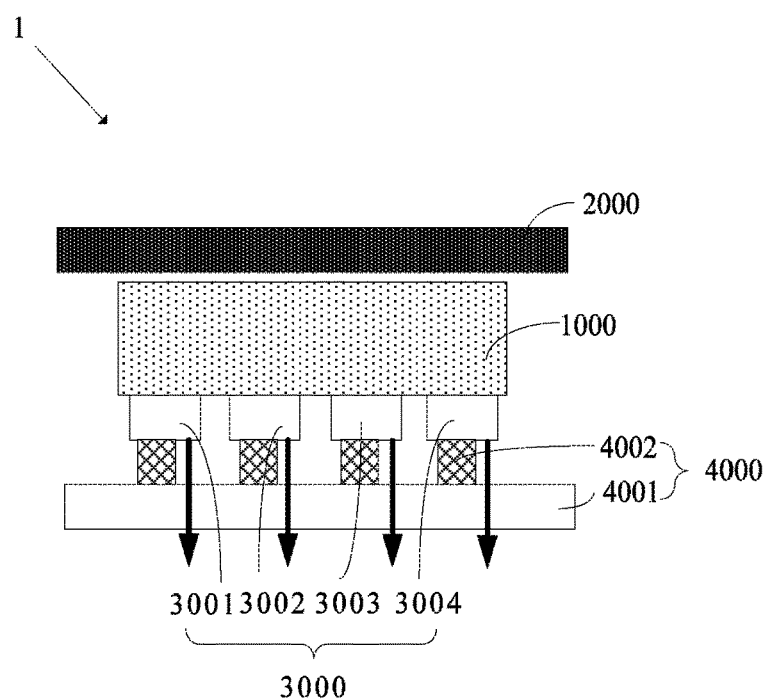
FIG. 1 is a structural schematic diagram of a display device according to the present disclosure.

As shown in FIG. 1, FIG. 1 is a structural schematic diagram of a display device according to the present disclosure. The display device 1 comprises a cover plate 2000, a quantum dot light-emitting diode 1000, a color filter unit 3000 and a substrate 4000 that are sequentially stacked.

The color filter unit 3000 comprises a plurality of red sub-pixels 3001 filtering a red light out, a plurality of green sub-pixels 3002 filtering a green light out, a plurality of blue sub-pixels 3003 filtering a blue light out, and a plurality of white sub-pixels 3004 filtering a white light out, wherein the plurality of white sub-pixels 3004 have no filter layer. The substrate 400 comprises a base substrate 4001 and a plurality of field effect transistors 4001 disposed on the base substrate 4001. Each field effect transistor 4001 comprises a semi-conductor layer, an insulating layer, a source electrode, a drain electrode and a gate electrode. It should be noted that packaging adhesives disposed between the cover plate 2000 and the substrate 4000 are used to protect the quantum dot light-emitting diode from water and oxygen.

Figure 2:
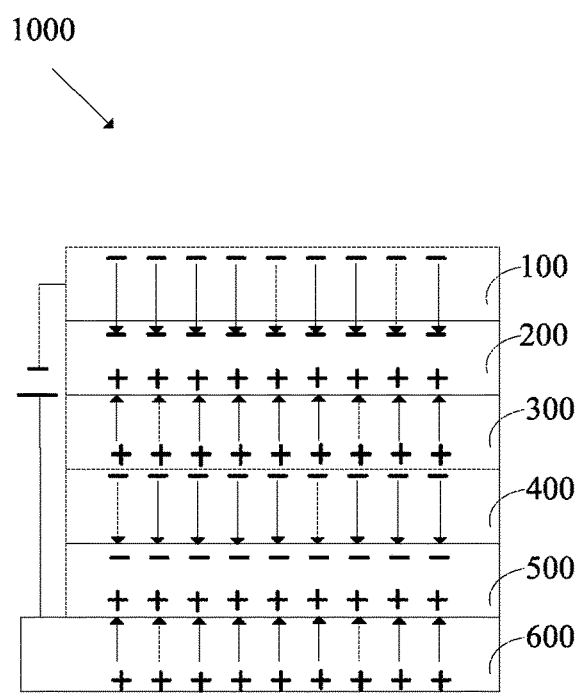
FIG. 2 is a first structural schematic diagram of a quantum dot light-emitting diode according to the present disclosure.

As shown in FIG. 2, FIG. 2 is a structural schematic diagram of a quantum dot light-emitting diode according to the present disclosure. The quantum dot light-emitting diode 1000 comprise a first electron layer 100, an organic light-emitting layer 200, a first hole layer 300, a second electron layer 400, a quantum dot light-emitting layer 500, and a second hole layer 600 that are sequentially stacked.

The first electron layer 100 is configured to transport first electrons to the organic light-emitting layer 200, the first hole layer 300 is configured to transport first holes to the organic light-emitting layer 200, and the organic light-emitting layer 200 is configured to emit a first light by recombining the first electrons and the first holes. The second electron layer 400 is configured to transport second electrons to the quantum dot light-emitting layer 500, the second hole layer 600 is configured to transport second holes to the quantum dot light-emitting layer, and the quantum dot light-emitting layer 500 is configured to emit a second light by recombining the second electrons and the second holes.

Figure 3:
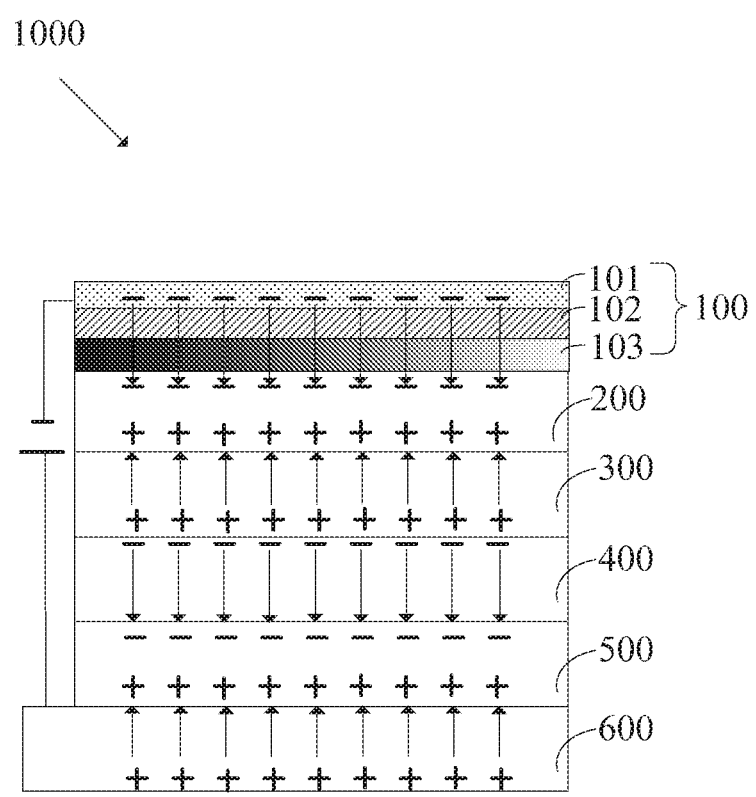
FIG. 3 is a second structural schematic diagram of a quantum dot light-emitting diode according to the present disclosure.

As shown in FIG. 3, the first electron layer 100 comprises a cathode 100, an electron injection layer 102 and a first electron transmission layer 103 that are sequentially stacked, wherein the first electron transmission layer 103 is disposed on the organic light-emitting layer 200.

The cathode 101 is configured to provide the first electrons. The cathode 101 is made of low work function metals, and component materials of the cathode 101 comprise one or more selected from a group consisting of Li, Mg, Ca, Sr, La, Ce, Eu, Yb, Al, Cs, Rb and Ag. The cathode 101 is formed by a process of vacuum evaporation, and a thickness of the cathode 101 ranges from 50 nm to 200 nm.

The electron injection layer 102 is configured to transport the first electrons to the first electron transmission layer 103. Component materials of the electron injection layer 102 comprise one or more selected from a group consisting of LiF, NaF, and Liq. The electron injection layer 102 is formed by a process of evaporation, and a thickness of the electron injection layer 102 ranges from 0.5 nm to 3 nm.

The first electron transmission layer 103 is configured to transport the first electrons to the organic light-emitting layer 200. Component materials of the first electron transmission layer 103 comprise one or more selected from a group consisting of BCP, TmPyPb, Bphen, TRZ, OXD-7, TAZ, TPB1, and TPyPhB. The first electron transmission layer 103 is formed by a process of evaporation, and a thickness of the first electron transmission layer 103 ranges from 20 nm to 60 nm.

The organic light-emitting layer 200 comprises a blue organic light-emitting layer. And the first light emitted from the organic light-emitting layer 200 by recombining the first electrons and the first holes is a blue light. Doped dyes of the organic light-emitting layer 200 comprise one or more selected from a group consisting of DSP-ph, DPVB1, and TPATAZ, and host materials of the organic light-emitting layer 200 comprise one or more selected from a group consisting of CBP, TcTa, and TMPyPb. The organic light-emitting layer 200 is formed by a process of evaporation, and a thickness of the organic light-emitting layer 200 ranges from 20 nm to 40 nm, and a wavelength of the first light emitted from the organic light-emitting layer 200 ranges from 450 nm to 480 nm. The organic light-emitting layer 200 is disposed to make the quantum dot light-emitting diode a long lifespan according to the present disclosure.

Figure 4:
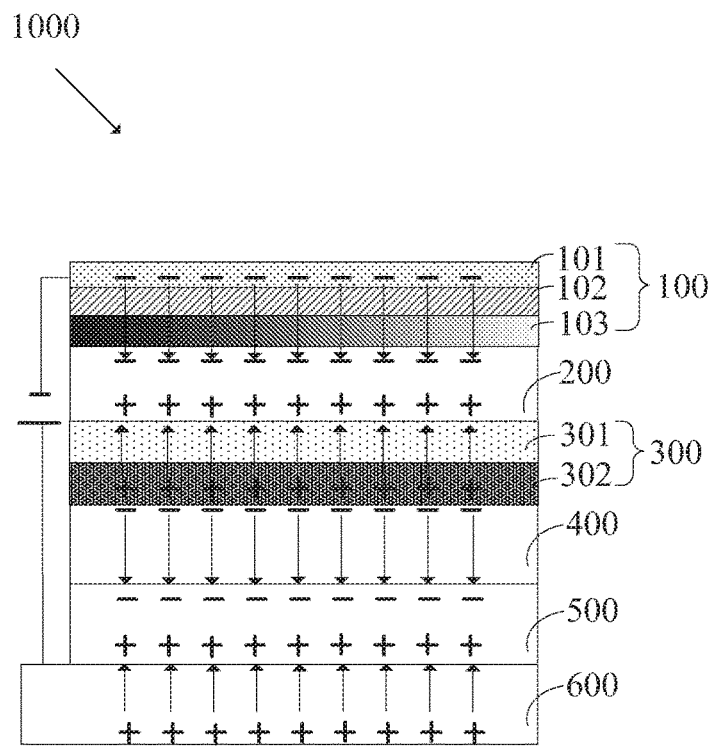
FIG. 4 is a third structural schematic diagram of a quantum dot light-emitting diode according to the present disclosure.

As shown in FIG. 4, the first hole layer 300 comprises a first hole transmission layer 301 and an hole generating layer 302 disposed on the second electron layer 400.

The hole generating layer 302 is configured to provide the first holes. Component materials of the hole generating layer 302 comprise one or more selected from a group consisting of HATCN, CuPc, and 2-TNATA. The hole generating layer is formed by a process of evaporation, and a thickness of the hole generating layer ranges from 5 nm to 50 nm.

The first hole transmission layer 301 is configured to transport the first holes to the organic light-emitting layer 200. Component materials of the first hole transmission layer 301 comprise one or more selected from a group consisting of NPB, TDAPB, PIDATA, TDAB, BFA-1T, and TPTE. The first hole transmission layer 301 is formed by a process of evaporation, and a thickness of the first hole transmission layer 301 ranges from 10 nm to 60 nm.

Figure 5:
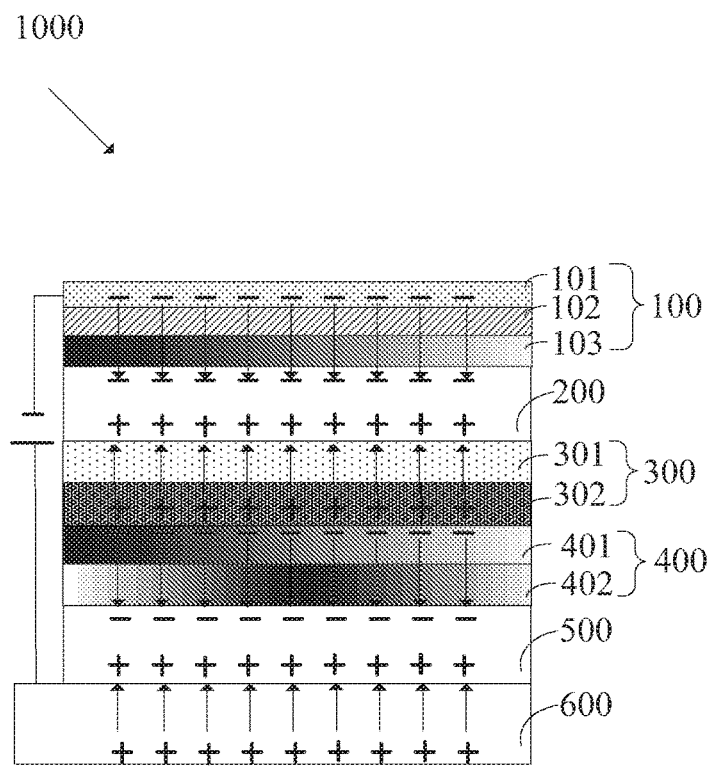
FIG. 5 is a fourth structural schematic diagram of a quantum dot light-emitting diode according to the present disclosure.

As shown in FIG. 5, the second electron layer 400 comprises an electron generating layer 401 and a second electron transmission layer 402 disposed on the quantum dot light-emitting layer 500.

The electron generating layer 401 is configured to provide the second electrons. Component materials of the electron generating layer 401 comprise metal materials and organic materials comprising one or more selected from a group consisting of Bphen:Li and Bphen:Yb. The electron generating layer is formed by a process of evaporation and a thickness of the electron generating layer ranges from 5 nm to 50 nm.

The second electron transmission layer 402 is configured to transport the second electrons to the quantum dot light-emitting layer 500. Component materials of the second electron transmission layer 402 comprise one or more selected from a group consisting of BCP, TmPyPb, Bphen, TRZ, OXD-7, TAZ, TPBI, and TPyPhB. The second electron transmission layer 402 is formed by a process of evaporation, and a thickness of the second electron transmission layer 402 ranges from 20 nm to 60 nm.

The quantum dot light-emitting layer 500 comprises a yellow quantum dot light-emitting layer. And the second light emitted from the quantum dot light-emitting layer 500 by recombining the second electrons and the second holes is a yellow light. Component materials of the quantum dot light-emitting layer 500 comprise one or more selected from a group yellow quantum dot light-emitting materials with core shell structure consisting of CdSe/ZnS, CdS/ZnS, CdSe/ZnSe, and CdS/ZnSe, and a particle size of the component materials ranges from 2 nm to 5 nm. The quantum dot light-emitting layer 500 is formed by a process of spin coating or nozzle printing, and a thickness of the quantum dot light-emitting layer 500 ranges from 20 nm to 40 nm. A wavelength of the second light emitted from the quantum dot light-emitting layer 500 ranges from 540 nm to 570 nm.

Figure 6:
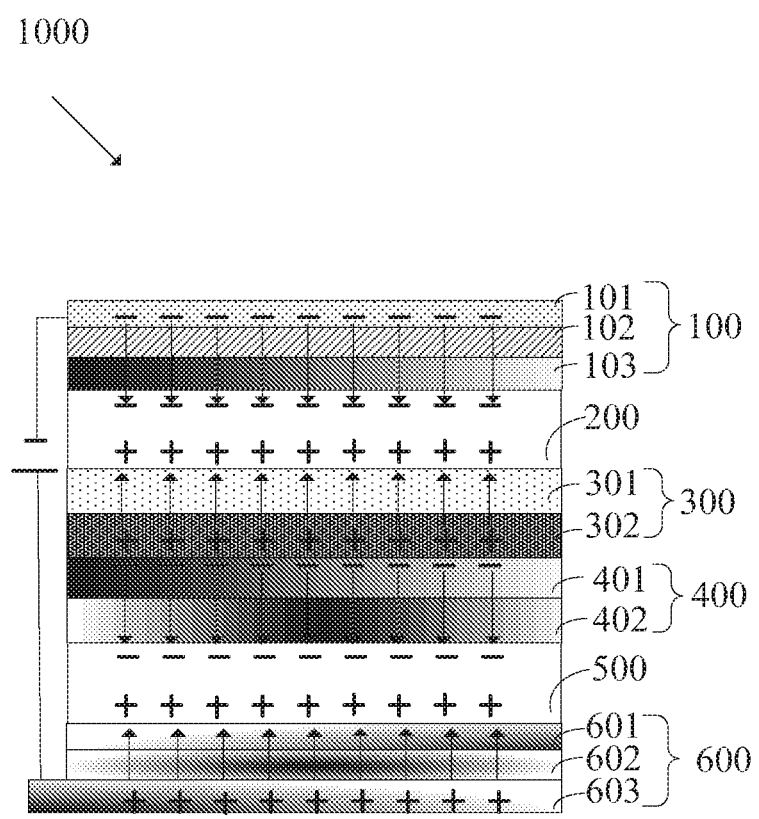
FIG. 6 is a fifth structural schematic diagram of a quantum dot light-emitting diode according to the present disclosure.

As shown in FIG. 6, the second hole layer 600 comprises a anode 603, an hole injection layer 602 and a second hole transmission layer 601 that are sequentially stacked, and the quantum dot light-emitting layer 500 is disposed on the second hole transmission layer 601. The anode 603 is made by ITO and configured to provide the second holes.

The hole injection layer 602 is configured to transport the second holes to the second hole transmission layer 601. Component materials of the hole injection layer comprise PEDOT:PSS. The hole injection layer 602 is formed by a process of spin coating or nozzle printing, and a thickness of the hole injection 602 ranges from 5 nm to 60 nm.

The second hole transmission layer 601 is configured to transport the second holes to the quantum dot light-emitting layer 500. Component materials of the second hole transmission layer 601 comprise one or more selected from a group consisting of PVK, TFB, and Poly-TPD. The second hole transmission layer 602 is formed by a process of spin coating or nozzle printing, and a thickness of the second hole transmission layer 602 ranges from 10 nm to 60 nm.

The present disclosure set up the organic light-emitting layer, the quantum dot light-emitting layer, two electron layers, and two hole layers to make the quantum dot light-emitting diode a longer lifespan, wherein the two electron layers emits electrons to the organic light-emitting layer and the quantum dot light-emitting layer, respectively, and the two hole layers emits holes to the organic light-emitting layer and the quantum dot light-emitting layer, respectively.

The present disclosure is described in detail in accordance with the above contents with the specific preferred examples. However, this present disclosure is not limited to the specific examples. For a person of ordinary skill in the art, on the premise of keeping the conception of the present disclosure, the technical personnel can also make simple deductions or replacements, all of which should be considered to belong to the protection scope of the present disclosure.

What is claimed is:

1. A quantum dot light-emitting diode, comprising: a first electron layer, an organic light-emitting layer, a first hole layer, a second electron layer, a quantum dot light-emitting layer, and a second hole layer that are sequentially stacked;
   wherein the first electron layer is configured to transport first electrons to the organic light-emitting layer;
   wherein the first hole layer is configured to transport first holes to the organic light-emitting layer;
   wherein the first electrons and the first holes are recombined in the organic light-emitting layer to form excitons, and the organic light-emitting layer is configured to emit a first light using energy generated by the excitons;
   wherein the second electron layer is configured to transport second electrons to the quantum dot light-emitting layer;
   wherein the second hole layer is configured to transport second holes to the quantum dot light-emitting layer;
   wherein the second electrons and the second holes are recombined in the quantum dot light-emitting layer to form excitons, and the quantum dot light-emitting layer is configured to emit a second light using energy generated by the excitons;

wherein the second electron layer comprises an electron generating layer and a second electron transmission layer disposed on the quantum dot light-emitting layer;
wherein the electron generating layer is configured to provide the second electrons;
wherein the second electron transmission layer is configured to transport the second electrons to the quantum dot light-emitting layer;
wherein component materials of the electron generating layer comprise organic materials.

2. The quantum dot light-emitting diode as claimed in claim 1, wherein doped dyes of the organic light-emitting layer comprise one or more selected from a group consisting of DSA-ph, DPVBI, host materials of the organic light-emitting layer comprise one or more selected from a group consisting of CBP, Taco, and TMPyPb, a thickness of the organic light-emitting layer ranges from 20 nm to 40 nm, and a wavelength of the first light emitted from the organic light-emitting layer ranges from 450 nm to 480 nm.

3. The quantum dot light-emitting diode as claimed in claim 1, wherein component materials of the quantum dot light-emitting layer comprise one or more selected from a group consisting of CdSe/ZnS, CdS/ZnS, CdSe/ZnSe, and CdS/ZnSe, a particle size of the component materials ranges from 2 nm to 5 nm, a thickness of the quantum dot light-emitting layer ranges from 20 nm to 40 nm, and a wavelength of the second light emitted from the quantum dot light-emitting layer ranges from 540 nm to 570 nm.

4. The quantum dot light-emitting diode as claimed in claim 1, wherein the first electron layer comprises a cathode, an electron injection layer and a first electron transmission layer that are sequentially stacked, and the first electron transmission layer is disposed on the organic light-emitting layer;
wherein the cathode is configured to provide the first electrons;
wherein the electron injection layer is configured to transport the first electrons to the first electron transmission layer;
wherein the first electron transmission layer is configured to transport the first electrons to the organic light-emitting layer.

5. The quantum dot light-emitting diode as claimed in claim 4, wherein component materials of the cathode comprise one or more selected from a group consisting of Li, Mg, Ca, Sr, La, Ce, Eu, Yb, Al, Cs, Rb, and Ag, and a thickness of the cathode ranges from 50 nm to 200 nm;
wherein component materials of the electron injection layer comprise one or more selected from a group consisting of LiF, NaF and Liq, and a thickness of the electron injection layer ranges from 0.5 nm to 3 nm;
wherein component materials of the first electron transmission layer comprise one or more selected from a group consisting of BCP, TmPyPb, Bphen, TRZ, OXD-7, TAZ, TPBI, and TPyPhB, and a thickness of the first electron transmission layer ranges from 20 nm to 60 nm.

6. The quantum dot light-emitting diode as claimed in claim 1, wherein the first hole layer comprises a first hole transmission layer and an hole generating layer disposed on the second electron layer;
wherein the hole generating layer is configured to provide the first holes;
wherein the first hole transmission layer is configured to transport the first holes to the organic light-emitting layer.

7. The quantum dot light-emitting diode as claimed in claim 6, wherein component materials of the first hole transmission layer comprise one or more selected from a group consisting of NPB, TDAPB, PIDATA, TDAB, BFA-1T, and TPTE, and a thickness of the first hole transmission layer ranges from 10 nm to 60 nm;
wherein component materials of the hole generating layer comprise one or more selected from a group consisting of HATCN, CuPc, and 2-TNATA, and a thickness of the hole generating layer ranges from 5 nm to 50 nm.

8. The quantum dot light-emitting diode as claimed in claim 1, wherein component materials of the electron generating layer comprise metal materials, and a thickness of the electron generating layer ranges from 5 nm to 50 nm;
wherein component materials of the second electron transmission layer comprise one or more selected from a group consisting of BCP, TmPyPb, Bphen, TRZ, OXD-7, TAZ, TPBI, and TPyPhB, and a thickness of the second electron transmission layer ranges from 20 nm to 60 nm.

9. The quantum dot light-emitting diode as claimed in claim 1, wherein the second hole layer comprises a anode, an hole injection layer and a second hole transmission layer that are sequentially stacked, and the quantum dot light-emitting layer is disposed on the second hole transmission layer;
wherein the anode is configured to provide the second holes;
wherein the hole injection layer is configured to transport the second holes to the second hole transmission layer;
wherein the second hole transmission layer is configured to transport the second holes to the quantum dot light-emitting layer.

10. The quantum dot light-emitting diode as claimed in claim 9, wherein component materials of the hole injection layer comprise PEDOT:PSS, and a thickness of the hole injection ranges from 5 nm to 60 nm;
wherein component materials of the second hole transmission layer comprise one or more selected from a group consisting of PVK, TFB, and Poly-TPD, and a thickness of the second hole transmission layer ranges from 10 nm to 60 nm.

11. A display device, comprising a cover plate, a quantum dot light-emitting diode, a color filter unit and a substrate that are sequentially stacked, and the quantum dot light-emitting diode comprises a first electron layer, an organic light-emitting layer, a first hole layer, a second electron layer, a quantum dot light-emitting layer, and a second hole layer that are sequentially stacked;
wherein the first electron layer is configured to transport first electrons to the organic light-emitting layer;
wherein the first hole layer is configured to transport first holes to the organic light-emitting layer;
wherein the first electrons and the first holes are recombined in the organic light-emitting layer to form excitons, and the organic light-emitting layer is configured to emit a first light using energy generated by the excitons;
wherein the second electron layer is configured to transport second electrons to the quantum dot light-emitting layer;
wherein the second hole layer is configured to transport second holes to the quantum dot light-emitting layer;
wherein the second electrons and the second holes are recombined in the quantum dot light-emitting layer to form excitons, and the quantum dot light-emitting layer is configured to emit a second light using energy generated by the excitons;

wherein the second electron layer comprises an electron generating layer and a second electron transmission layer disposed on the quantum dot light-emitting layer;

wherein the electron generating layer is configured to provide the second electrons;

wherein the second electron transmission layer is configured to transport the second electrons to the quantum dot light-emitting layer;

wherein component materials of the electron generating layer comprise organic materials.

12. The display device as claimed in claim 11, wherein doped dyes of the organic light-emitting layer comprise one or more selected from a group consisting of DSA-ph, DPVBI, host materials of the organic light-emitting layer comprise one or more selected from a group consisting of CBP, TcTa, and TMPyPb, a thickness of the organic light-emitting layer ranges from 20 nm to 40 nm, and a wavelength of the first light emitted from the organic light-emitting layer ranges from 450 nm to 480 nm.

13. The quantum dot light-emitting diode as claimed in claim 11, wherein component materials of the quantum dot light-emitting layer comprise one or more selected from a group consisting of CdSe/ZnS, CdS/ZnS, CdSe/ZnSe, and CdS/ZnSe, a particle size of the component materials ranges from 2 nm to 5 nm, a thickness of the quantum dot light-emitting layer ranges from 20 nm to 40 nm, and a wavelength of the second light emitted from the quantum dot light-emitting layer ranges from 540 nm to 570 nm.

14. The display device as claimed in claim 11, wherein the first electron layer comprises a cathode, an electron injection layer and a first electron transmission layer that are sequentially stacked, and the first electron transmission layer is disposed on the organic light-emitting layer;

wherein the cathode is configured to provide the first electrons;

wherein the electron injection layer is configured to transport the first electrons to the first electron transmission layer;

wherein the first electron transmission layer is configured to transport the first electrons to the organic light-emitting layer.

15. The display device as claimed in claim 14, wherein component materials of the cathode comprise one or more selected from a group consisting of Li, Mg, Ca, Sr, La, Ce, Eu, Yb, Al, Cs, Rb, and Ag, and a thickness of the cathode ranges from 50 nm to 200 nm;

wherein component materials of the electron injection layer comprise one or more selected from a group consisting of LiF, NaF, and Liq, and a thickness of the electron injection layer ranges from 0.5 nm to 3 nm;

wherein component materials of the first electron transmission layer comprise one or more selected from a group consisting of BCP, TmPyPb, Bphen, TRZ, OXD-7, TAZ, TPBI, and TPyPhB, and a thickness of the first electron transmission layer ranges from 20 nm to 60 nm.

16. The display device as claimed in claim 11, wherein the first hole layer comprises a first hole transmission layer and an hole generating layer disposed on the second electron layer;

wherein the hole generating layer is configured to provide the first holes;

wherein the first hole transmission layer is configured to transport the first holes to the organic light-emitting layer.

17. The display device as claimed in claim 16, wherein component materials of the first hole transmission layer comprise one or more selected from a group consisting of NPB, TDAPB, PIDATA, TDAB, BFA-1T, and TPTE, and a thickness of the first hole transmission layer ranges from 10 nm to 60 nm;

wherein component materials of the hole generating layer comprise one or more selected from a group consisting of HATCN, CuPc, and 2-TNATA, and a thickness of the hole generating layer ranges from 5 nm to 50 nm.

18. The display device as claimed in claim 11, wherein component materials of the electron generating layer comprise metal materials, and a thickness of the electron generating layer ranges from 5 nm to 50 nm;

wherein component materials of the second electron transmission layer comprise one or more selected from a group consisting of BCP, TmPyPb, Bphen, TRZ, OXD-7, TAZ, TPBI, and TPyPhB, and a thickness of the second electron transmission layer ranges from 20 nm to 60 nm.

* * * * *